(12) United States Patent
Lin et al.

(10) Patent No.: US 10,078,776 B2
(45) Date of Patent: Sep. 18, 2018

(54) NOISE REDUCED CAPACITIVE FINGERPRINT SENSOR AND CAPACITIVE SENSING UNIT INCLUDED THEREIN

(71) Applicant: SunASIC Technologies, Inc., New Taipei (TW)

(72) Inventors: Chi Chou Lin, Taipei (TW); Zheng Ping He, Taipei (TW)

(73) Assignee: SunASIC Technologies Inc., New Taipei (TW)

( * ) Notice: Subject to any disclaimer, the term of this patent is extended or adjusted under 35 U.S.C. 154(b) by 84 days.

(21) Appl. No.: 15/381,182

(22) Filed: Dec. 16, 2016

(65) Prior Publication Data

US 2018/0173919 A1  Jun. 21, 2018

(51) Int. Cl.
| | | |
|---|---|---|
| *G06K 9/00* | (2006.01) | |
| *H04N 5/365* | (2011.01) | |
| *H03K 17/96* | (2006.01) | |
| *H01L 27/06* | (2006.01) | |

(52) U.S. Cl.
CPC ........ *G06K 9/0002* (2013.01); *H01L 27/0629* (2013.01); *H03K 17/9622* (2013.01); *H04N 5/365* (2013.01)

(58) Field of Classification Search
CPC .. G06K 9/0002; H01L 27/0629; H04N 5/365; H03K 17/9622
See application file for complete search history.

(56) References Cited

U.S. PATENT DOCUMENTS

| | | | |
|---|---|---|---|
| 5,325,442 A | 6/1994 | Knapp | |
| 5,940,526 A | 8/1999 | Setlak et al. | |
| 6,016,355 A | 1/2000 | Dickinson et al. | |
| 6,448,790 B1 * | 9/2002 | Imai | G06K 9/0002 |
| | | | 324/661 |
| 7,099,497 B2 | 8/2006 | Chou et al. | |
| 7,663,380 B2 * | 2/2010 | Chuang | G06K 9/0002 |
| | | | 324/662 |
| 8,319,307 B1 * | 11/2012 | Williams | H01L 27/14636 |
| | | | 250/208.1 |
| 9,152,841 B1 | 10/2015 | Riedijk | |
| 2016/0180619 A1 | 6/2016 | Riedijk | |
| 2016/0275332 A1 | 9/2016 | Lin et al. | |
| 2016/0379034 A1 * | 12/2016 | Lin | G06K 9/0002 |
| | | | 382/124 |

OTHER PUBLICATIONS

Extended European Search Report for Application No. 17167167.0, dated Oct. 20, 2017.

* cited by examiner

*Primary Examiner* — John Strege
(74) *Attorney, Agent, or Firm* — Che-Yang Chen; Law Offices of Scott Warmuth

(57) ABSTRACT

A capacitive fingerprint sensor which includes capacitive sensing units is disclosed. Each of the capacitive sensing unit includes a sensing electrode; a first switch; a voltage follower; and a reference capacitor. The voltage follower includes an adjustable current source, for providing at least two distinct current levels; and a MOS transistor. The MOS transistor includes a source node, connected to ground via the adjustable current source and serves as an output node of the voltage follower; a gate node, connected to the sensing electrode and serves as an input node of the voltage follower; a drain node, connected to a power source, for providing power to the voltage follower; and a bulk node, connected to the source node.

14 Claims, 10 Drawing Sheets

NOISE REDUCED CAPACITIVE FINGERPRINT SENSOR AND CAPACITIVE SENSING UNIT INCLUDED THEREIN

FIELD OF THE INVENTION

The present invention relates to a capacitive fingerprint sensor which includes capacitive sensing units. More particularly, the present invention relates to a noise reduction technique used in capacitive sensing units.

BACKGROUND OF THE INVENTION

Fingerprint sensing technology is increasingly recognized as a reliable and convenient way to identify individuals and to verify individual identity. Fingerprints, like various other biometric characteristics, are the distinctive, measurable characteristics used to label and describe an individual. The applications for fingerprints sensors are plentiful. For example, fingerprint sensors may be used to provide access control in stationary applications, such as security checkpoints, door locks. Fingerprint sensors may also be used to provide access control in portable applications, such as portable computers, smart phones, information appliances, and data storage devices. Recently, fingerprint authentication technologies are further developed to be used in a wider range, such as payment authorization on a portable device, such as a credit card. Accordingly, some applications, particularly portable applications, may require fingerprint sensing devices to be compact, highly reliable, and inexpensive.

Various fingerprint sensing methods, techniques, and devices have been in use or proposed. For example, optical and capacitive fingerprint sensing devices are currently on the market or under development. Optical fingerprint sensors utilize reflected light from a fingertip to capture a digital image. On the other hand, capacitive fingerprint sensors utilize distribution of electrical field which is affected by the capacitance between the fingertip and the sensor to generate a fingerprint image.

Generally, there are two types of capacitive fingerprint sensing techniques in the market now: passive and active. Both types of capacitive techniques utilize the principle of capacitance to generate fingerprint images. Passive capacitive technique, such as the sensor disclosed in U.S. Pat. No. 5,325,442 by inventor Alan G. Knapp and U.S. Pat. No. 6,016,355 by inventor Alexander George Dickinson, utilizes an array of sensing units (each sensing unit contains a metal plate as a sensing electrode), to apply an electrical current to the capacitance formed between the metal plates and the fingertip. The method obtains the capacitance differences between the sensing units by measuring the different charging or discharge currents, and further using the capacitance differences to distinguish ridges from valleys. Others, such as U.S. Pat. No. 7,663,380 by inventor Kai Lan Chuang and U.S. Pat. No. 7,099,497 by inventor Bruce C. S. Chou, improve the idea of Knapp by utilizing pre-charged capacitors as a source of the charging current/voltage to improve the sensitivity of the sensing units. However, the signal strength and image quality decline significantly as the thickness of the protective layer increases.

Active capacitive technique, such as the sensor disclosed in U.S. Pat. No. 5,940,526 by Dale R. Setlak, is similar to passive technique but requires excitation to the epidermal skin layer of the sensed fingertip by applying different voltages to the sensed fingertip via a metal ring or strip. Active capacitive technique may render a better image quality while the packaging structure meets the need of the sensor protection by increasing the thickness of the cover material. However, there is a major disadvantage in active capacitive technique. The excitation voltage applied via the metal ring is significantly reduced when a low impedance path that leads to ground exists between the metal ring and human body. This problem causes the system to be unreliable, particularly for the portable devices with chassis connected to ground. The workarounds of this problem may either require a sophisticated ground isolation structure, such as the sensor disclosed in U.S. Pat. No. 9,152,841 by Frank Robert Riedijk, or much higher excitation voltage level which also increases complexity and cost.

In order to overcome the aforementioned drawbacks of passive and active capacitive fingerprint sensing techniques, a capacitive fingerprint sensing device that can achieve a high-quality fingerprint representation even if a thick protective layer is used without applying excitation voltage to the fingertip is highly desired.

SUMMARY OF THE INVENTION

In order to provide a more robust capacitive fingerprint sensing device capable of achieving a high-quality fingerprint representation, a capacitive sensing unit for a capacitive fingerprint sensor is disclosed by the present invention. The capacitive sensing unit includes: a sensing electrode; a first switch, for providing a constant bias voltage to all components connected to the sensing electrode while being switched on; a voltage follower, including: an adjustable current source, for providing at least two distinct current levels; and a MOS transistor, including: a source node, connected to ground via the adjustable current source, the source node serves as an output node of the voltage follower; a gate node, connected to the sensing electrode, the gate node serves as an input node of the voltage follower; a drain node, connected to a power source for providing power to the voltage follower; and a bulk node, connected to the source node; and a reference capacitor, formed between the output node of the voltage follower and the sensing electrode. The MOS transistor is operated in the saturation region.

According to the present invention, the adjustable current source may provide a first current level for setting up the bias voltage to the voltage follower and at least a second current level for reading the output voltage. The at least two distinct current levels are constant current levels. The adjustable current source may include: a first constant current source; a second constant current source; and a second switch, for switching between at least two distinct current levels. The adjustable current source may further include a third switch, for switching between at least two distinct current levels. The adjustable current source may be a bias voltage controlled current mirror. The adjustable current source may be a current controlled current mirror. The sensing electrode may be a conductive plate. The capacitive sensing unit may further include: a lower metal plate, formed in a lower conducting layer, connected to the output node of the voltage follower; and at least one insulating layer, formed between the sensing electrode and the lower conducting layer. The reference capacitor may be formed between the conductive plate and the lower conducting layer.

The MOS transistor may be operated at at least two distinct operation points in the saturation region, and the process variation of the sensing unit can be compensated by having the design parameters to meet the relationship:

$$90\% \frac{(C_r + C_p)}{C_r} \leq \frac{\Delta V_{gs\_0}}{\Delta V_{gs\_1}} \leq 110\% * \frac{(C_r + C_p)}{C_r}$$

where $C_r$ is the capacitance of the reference capacitor, $C_p$ is the capacitance of the parasitic capacitor naturally formed between ground and the sensing electrode, $\Delta V_{gs\_0}$ is the voltage change caused by process variation at a first operation point, and $\Delta V_{gs\_1}$ is the voltage change caused by process variation at a second operation point.

While an object, e.g., a fingertip, is put over the sensor and detected by the capacitive sensing unit, a capacitor is formed between the sensing electrode and the object. One node of the capacitor is formed by the sensing electrode and another node is formed by the surface of the object. The object is connected to ground. For example, the fingertip is connected to ground via some portion of the human body.

The present invention also discloses a capacitive fingerprint sensor including a number of capacitive sensing units mentioned above to form a fingerprint sensing array.

The present invention further discloses a sensing circuit for measuring a capacitance formed between an object and the sensing circuit. The circuit may include: a sensing electrode; an output node; a reference capacitor; a MOS transistor; and an adjustable current source. The capacitance to be measured is formed between the object and the sensing electrode. An output voltage is measured at the output node. One node of the reference capacitor is connected to the sensing electrode and the other node is connected to the output node. The MOS transistor may include: a source node; a gate node, connected to the sensing electrode; a drain node, connected to a power source for providing power to the transistor; and a bulk node, connected to the source node. The adjustable current source is formed between the source node of the MOS transistor and ground, for providing at least two distinct current levels to the MOS transistor. The MOS transistor is operated in the saturation region, and the MOS transistor and the adjustable current source together behaves as a voltage follower. The capacitance has one node connected to ground and another node connected to the sensing electrode. The at least two distinct current levels may include a first current level and at least a second current level. The first current level provides a constant bias current level for setting up the bias voltage to the voltage follower. The second current level(s) provides another constant bias current level for reading the output voltage.

DETAILED DESCRIPTION OF THE PREFERRED EMBODIMENTS

The present invention will now be described more specifically with reference to the following embodiments.

A capacitive fingerprint sensor is used to capture fingerprint image(s) of which the gray level of pixels represents the ridge and valley of a fingertip, by detecting a change in the distance between the surface of the capacitive fingerprint sensor and the skin of the fingertip, which causes measurable capacitance variation. The capacitive fingerprint sensor commonly consists of a two-dimensional array of capacitive sensing units, a signal conditioning circuit, a control and timing logic, a data buffer, and input/output ports. Sensitivity of the sensing unit plays a major role to determine image quality of captured fingerprint images under various use conditions. Different packaging structures are used under various use conditions to protect capacitive fingerprint sensors, whereas different packaging structure may affect sensitivity of the capacitive sensing units in the capacitive fingerprint sensors. In order to pick up attenuated capacitance caused by having the capacitive fingerprint sensor embedded under a thick protective layer, sensing units of higher sensitivity is required. In the meantime, high sensitivity also amplifies fixed pattern noise caused by material and/or geometric mismatch and variation of parameters which control the semiconductor fabrication process. In the present invention, we propose a capacitive sensing unit that is capable of measuring very small capacitance. For such a task, the main challenge is the process control issues to reduce fixed pattern noise. This innovative technique provides high sensitivity to small capacitance and good immunity to mismatch of device characteristic when certain parameters are chosen properly.

Figure 1:
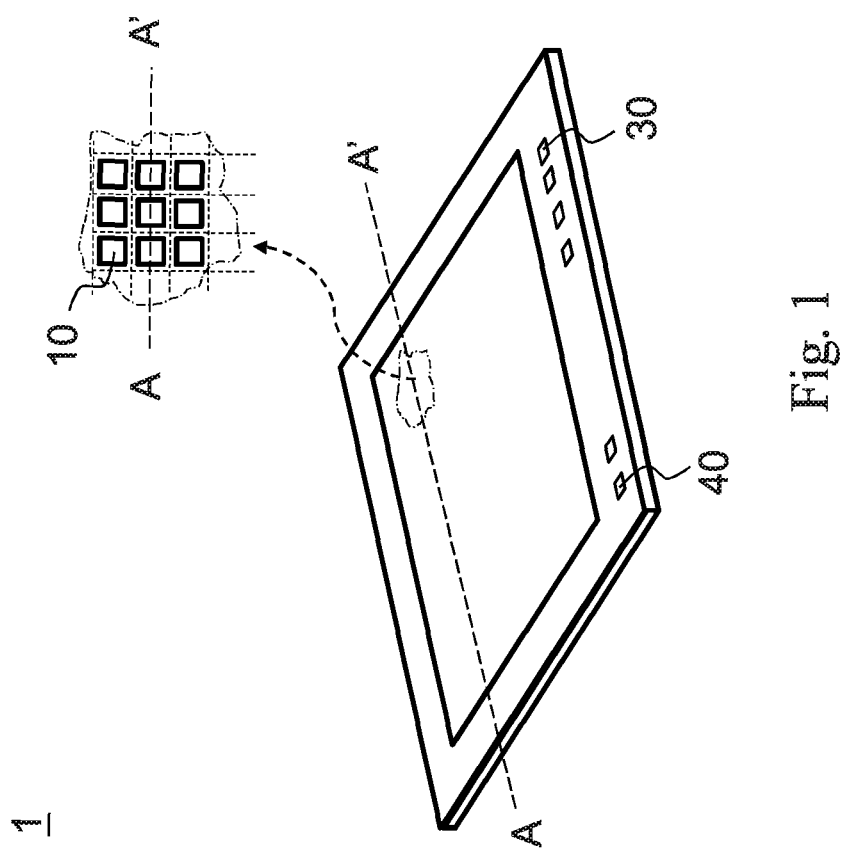
FIG. 1 is a schematic view of a fingerprint sensor according to the present invention.

Please refer to FIG. 1. FIG. 1 schematically shows a capacitive fingerprint sensor 1 according to the present invention. The capacitive fingerprint sensor 1 includes an array of capacitive sensing units 10, contact pads 40 of a power supply, and contact pads 30 of an I/O interface.

Figure 2:
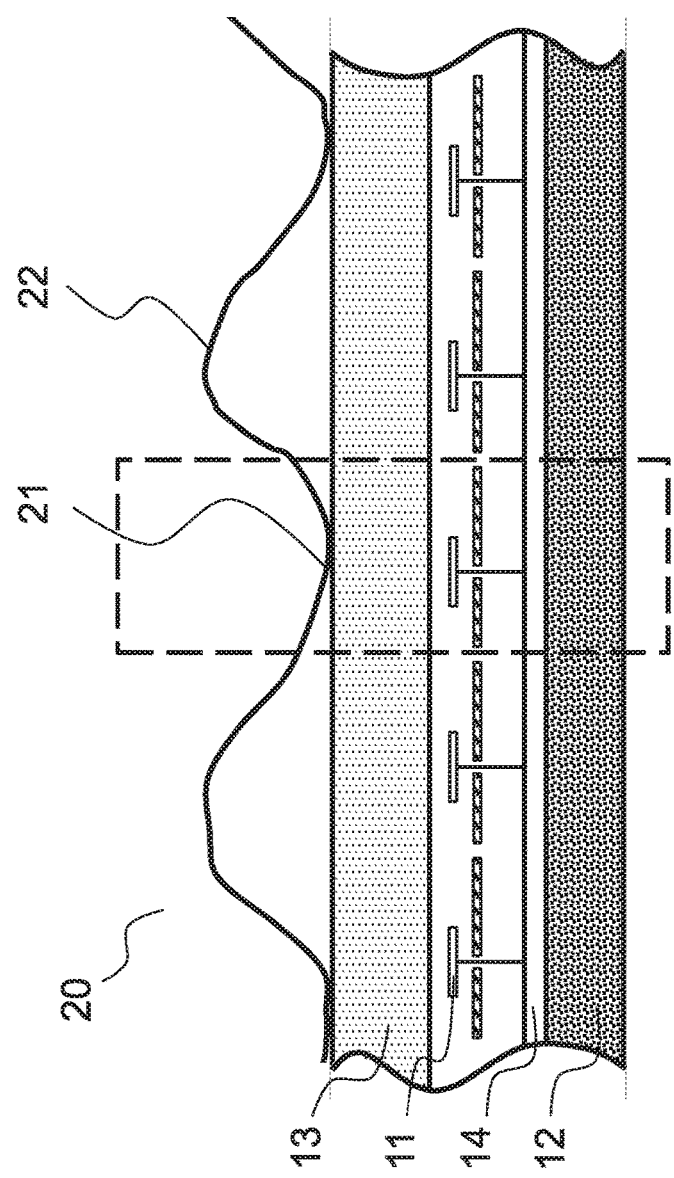
FIG. 2 is a schematic cross-section of a portion of the fingerprint sensor taken along line A-A' in FIG. 1.

FIG. 2 is a schematic cross-section of a portion of the capacitive fingerprint sensor 1 taken along line A-A' in FIG. 1, with a protective layer 13 located on top of the sensor and a fingertip 20 placed on the protective layer 13. The protective layer 13 may be made of glass, sapphire, epoxy compound, or coating material. The capacitive fingerprint sensor 1 comprises a semiconductor substrate 12, having the array of capacitive sensing units 10 formed thereon. The surface of the fingertip 20 comprises ridges 21 that are in contact with the protective layer 13 and valleys 22 that are spaced apart from the protective layer 13. Five capacitive sensing units 10 are shown in FIG. 2, and one of the capacitive sensing units 10 is enclosed by a dashed frame. Each capacitive sensing unit 10 comprises a sensing electrode 11 in the form of a conductive plate. Below the conductive plate are additional metal structures and active semiconductor circuitry schematically shown by a region 14 in FIG. 2. Details of the additional metal structures and active semiconductor circuitry will be described in later paragraphs.

Figure 3:
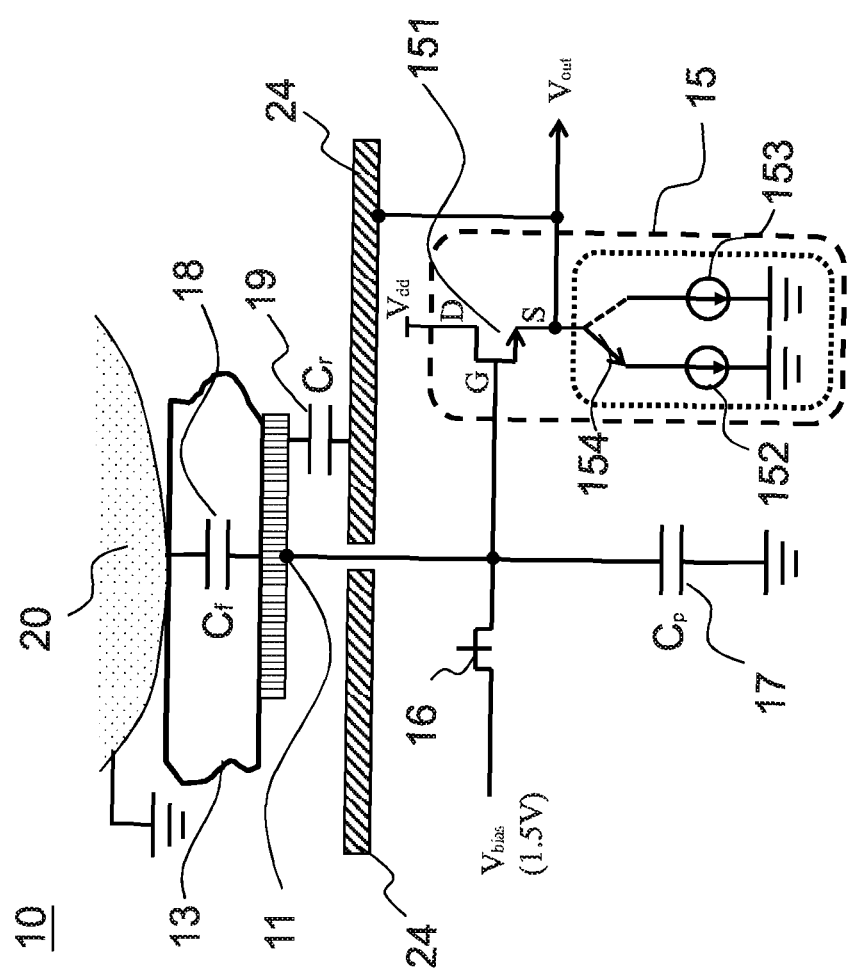
FIG. 3 is a schematic view of a sensing unit enclosed in the dashed frame in FIG. 2.
Figure 5:
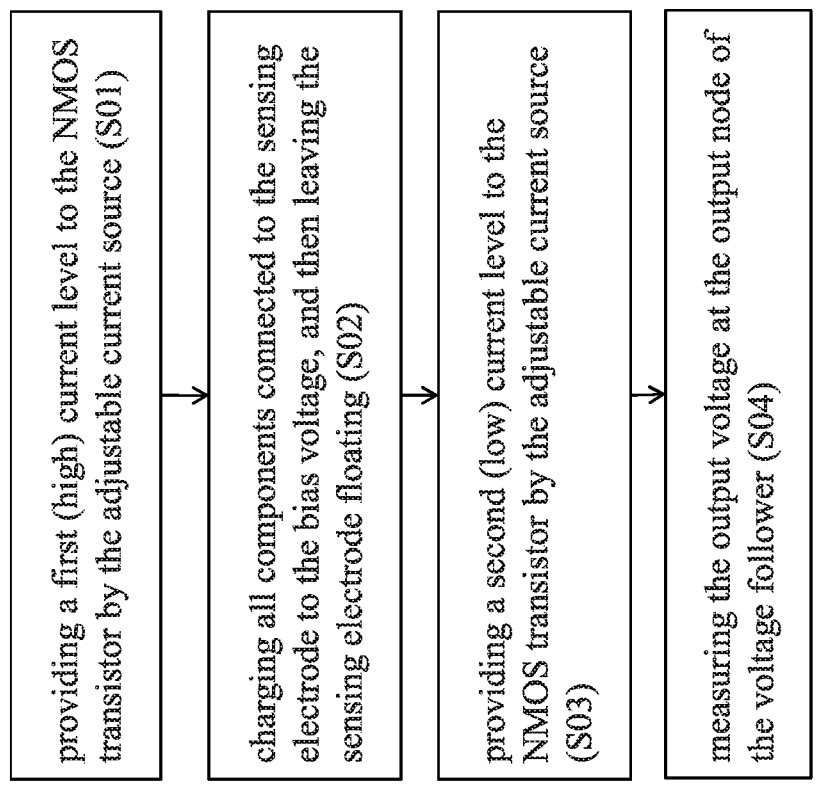
FIG. 5 is a flowchart illustrating a procedure to operate the sensing units in the fingerprint sensor.

FIG. 3 is a schematic view of the capacitive sensing unit 10 enclosed in the dashed frame in FIG. 2. As schematically indicated in FIG. 3, each capacitive sensing unit 10 comprises, in addition to the sensing electrode (conductive plate) 11, a lower metal plate 24, a voltage follower 15, and a first switch 16. The sensing electrode 11 is connected to the circuitry in the region 14 below the sensing electrode 11 via a conductive path (the vertical line) in FIG. 2. A finger capacitor 18 to be measured, having a capacitance $C_f$, is formed by the sensing electrode 11 and the portion of the fingertip 20 above the protective layer 13 while the fingertip 20 enters a detecting range of the capacitive sensing unit 10. A reference capacitor 19, having a capacitance $C_r$, is formed by the sensing electrode 11 and the lower metal plate 24. In manufacturing processes, the lower metal plate 24 is formed in a lower conducting layer and connected to the output node of the voltage follower 15. In order to electrically insulate the lower conducting layer from the sensing electrode 11, at least one insulating layer may be formed between the sensing electrode 11 and the lower conducting layer. Thus, the reference capacitor 19 is naturally formed between the sensing electrode 11 (conductive plate) and the lower metal plate 24. A fixed-value parasitic capacitor 17, having a capacitance $C_p$, is formed between ground and the sensing electrode 11. The parasitic capacitor 17 represents all parasitic capacitances naturally formed between ground and the sensing electrode 11 and within the conductive path. For example, the first switch may be an N-type switch (a four-terminal NMOS transistor), with the body connected to the most negative supply (usually ground) and the gate used for switch control. A parasitic capacitance naturally exists between the gate, body, and the drain node which is connected to the sensing plate via the conductive path. Therefore, the parasitic capacitance in the first switch 16 contributes a portion capacitances to the total capacitance of the parasitic capacitor 17 ($C_p$). The combined capacitance $C_x$ ($C_x=C_p+C_r$) forms the total capacitance to be measured. Unlike standard voltage follower, the NMOS voltage follower 15 comprises an adjustable current source. In the present embodiment, the NMOS voltage follower 15, illustrated in the form of a transistor level circuit schematic and enclosed by a dashed frame, comprises a NMOS transistor 151, a first constant current source 152, a second constant current source 153, and a second switch 154. The second switch 154 is a single pole, double throw (SPDT) switch, having a common terminal (pole terminal) and two "throw terminals. The first constant current source 152, the second constant current source 153, and the second switch 154 together form the adjustable current source (enclosed by the dotted frame). A drain node (D) of the NMOS transistor 151 is connected to a power source for providing power to the voltage follower. A source node (S) of the NMOS transistor 151 is connected to the common terminal of the second switch 154 and serves as an output node of the voltage follower 15. A gate node (G) of the NMOS transistor 151 is connected to the sensing electrode 11 and serves as an input node of the voltage follower. A bulk node connected to the source node (shown in FIG. 7). Typically, the bulk node is not labeled but is shown as an arrowhead in the symbol of the NMOS transistor 151 in FIG. 7. The first constant current source 152 is formed between the first "throw" terminal of the second switch 154 and ground. The second constant current source 153 is formed between the second "throw" terminal of the second switch 154 and ground. The second switch 154 switches between the first constant current source 152 and the second constant current source 153, for providing different constant current levels for operating the NMOS transistor 151 at different conditions or steps, as shown in FIG. 5. A higher constant current level is provided for setting up the bias voltage to the voltage follower 15. A lower constant current level is provided for reading the output voltage. In order to function as a voltage follower, the NMOS transistor is operated in the saturation region. The first switch 16 is connected to the sensing electrode 11, for providing a bias voltage to all components connected to the sensing electrode 11 while being switched on.

Figure 4:
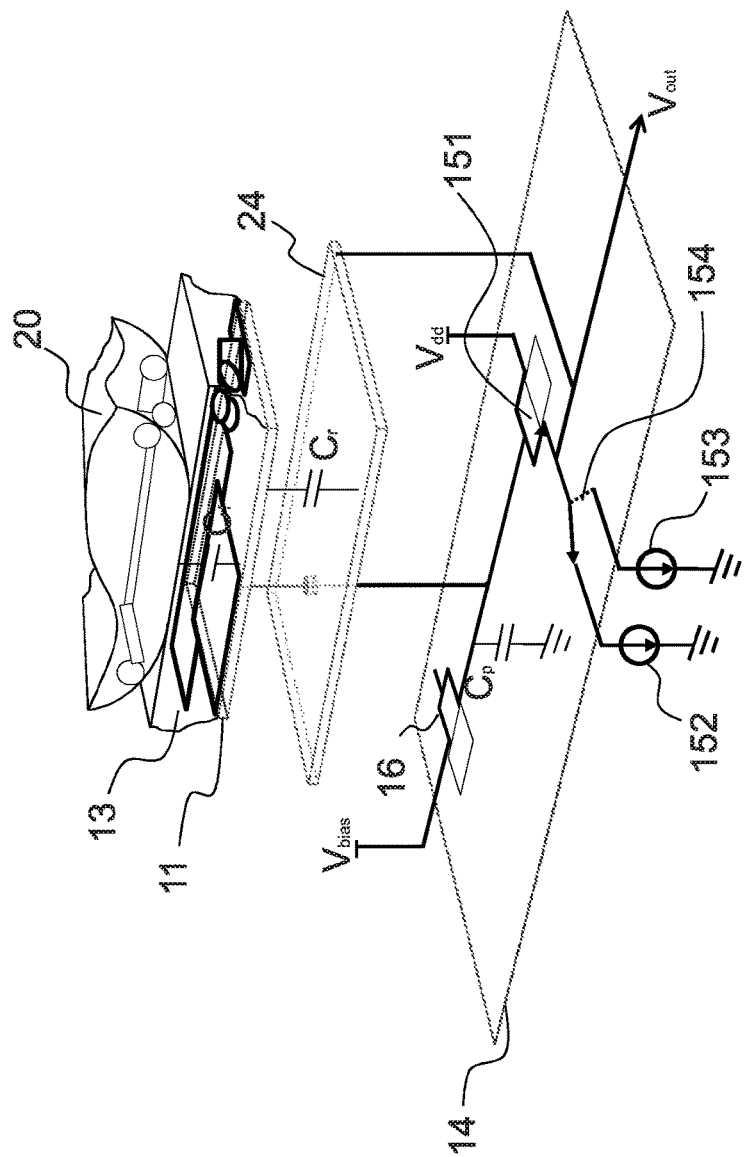
FIG. 4 is a hybrid of a partly structural and partly circuit schematic illustration of the sensing unit in FIG. 3.

FIG. 4 is a hybrid of a partly structural and partly circuit schematic illustration of the capacitive sensing unit 10 in FIG. 3. The protective layer 13, the sensing electrode 11 and the lower metal plate 24 are schematically shown in an exploded perspective view, while the circuitry in region 14 in FIG. 2 is illustrated in the form of a transistor level circuit schematic.

A procedure for operating the capacitive fingerprint sensor 1 is also disclosed. Please refer to the flowchart in FIG. 5, which illustrates a procedure to operate the capacitive sensing units 10 in the capacitive fingerprint sensor 1. The method comprises the following steps: providing a first (high) current level (4 uA) to the NMOS transistor 151 by the adjustable current source (S01); charging all components connected to the sensing electrode 11 to the bias voltage, and then leaving the sensing electrode 11 floating (S02); providing a second (low) current level (1 uA) to the NMOS transistor 151 by the adjustable current source (S03); and measuring the output voltage at the output node of the voltage follower (S04).

Figure 6:
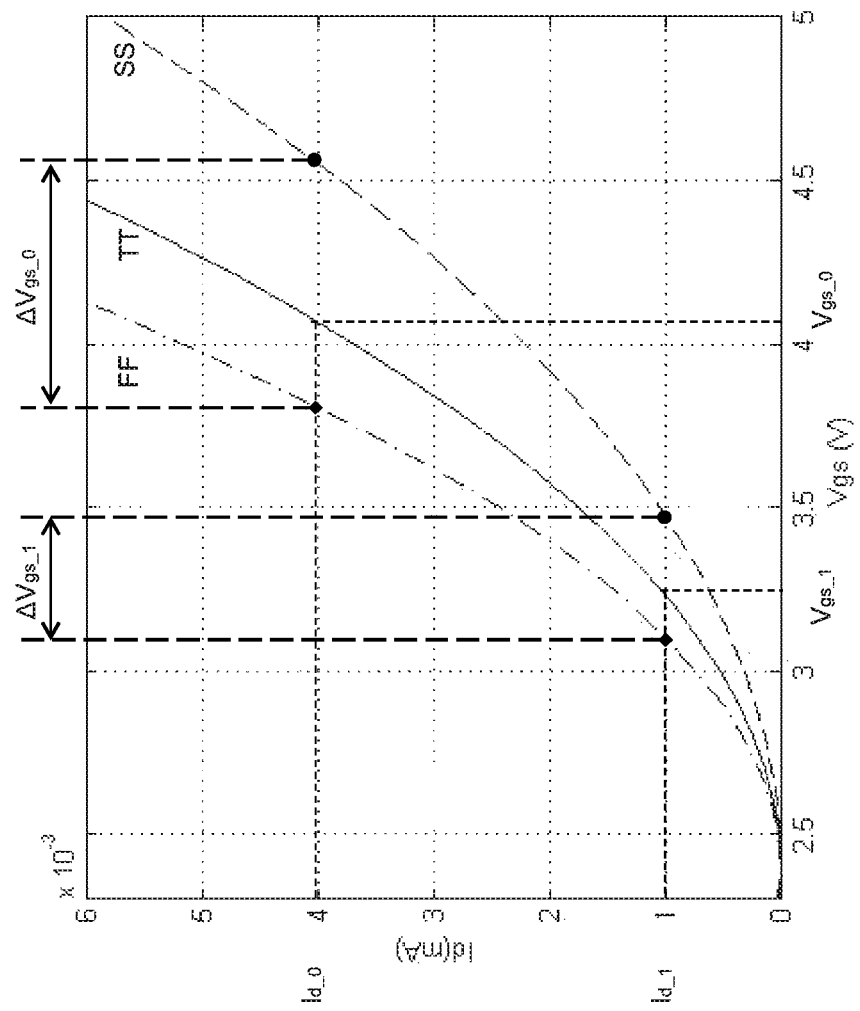
FIG. 6 is an $I_d$-to-$V_{gs}$ curve of a NMOS transistor operating in the saturation region.

Please refer to FIG. 6. FIG. 6 is an $I_d$-to-$V_{gs}$ curve of a NMOS transistor operating in the saturation region. The solid line, dashed line, and the dotted-dashed line shows typical-typical (TT), slow-slow (SS), and fast-fast (FF) process corners, respectively. A process corner is a design-of-experiments technique that refers to a variation of fabrication parameters used in applying an integrated circuit design to a semiconductor wafer. The current from drain to source ($I_d$) in the saturation region is modeled as:

$$I_d = \frac{\mu_n C_{OX}}{2} \frac{W}{L}(V_{gs} - V_{th})^2(1 + \lambda V_{ds}),$$

where $V_{th}$ is the threshold voltage of the NMOS transistor 151, $V_{gs}$ is the gate-to-source bias, $V_{ds}$ is the drain-to-source voltage, $\mu_n$ is the charge-carrier effective mobility, W is the gate width, L is the gate length, $C_{ox}$ is the gate oxide capacitance per unit area, and $\lambda$ is the channel-length modulation parameter.

Figure 7:
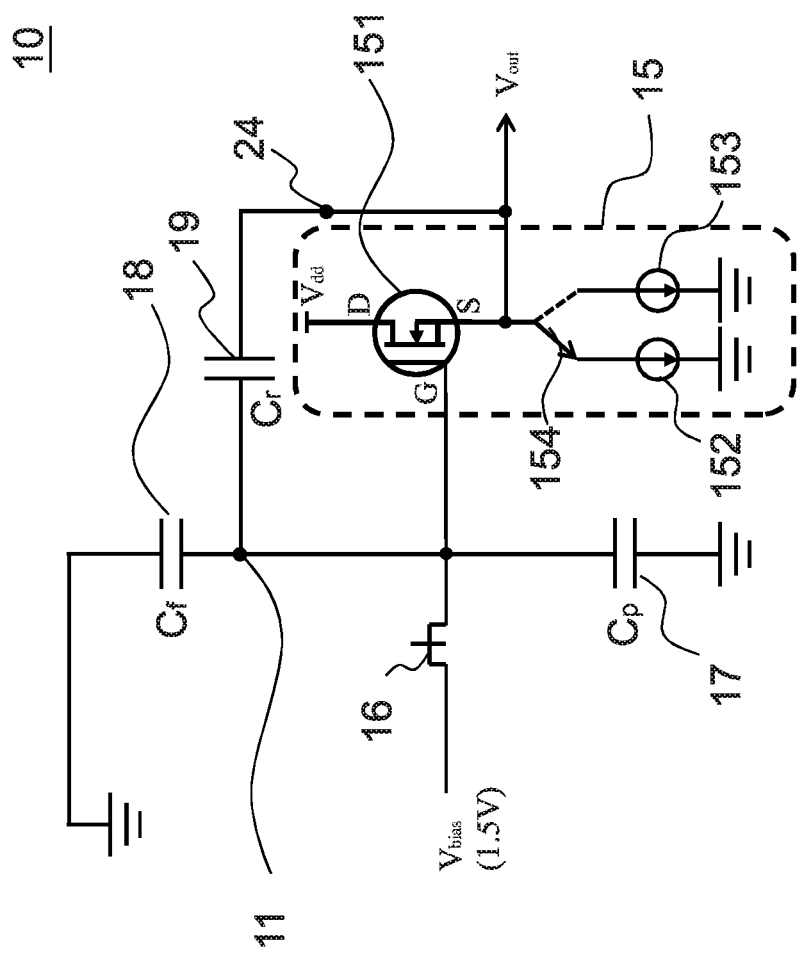
FIG. 7 is a schematic circuit diagram of the sensing unit according to the present invention.

To aid the understanding of the working principle of the capacitive sensing unit 10, the same schematic configuration is also shown in FIG. 7. The structure (conductive plate and the lower metal plate 24) are simplified as nodes, leaving only the circuit schematic for illustration. The finger capacitor 18, $C_f$ represents the small capacitance to be measured, with one terminal connected to ground, and the other connected to the sensing electrode 11. The reference capacitor 19, $C_r$, represents a reference (feedback) capacitor connecting the source and the gate node of the voltage follower 15. The current source that provides two distinct current levels to the NMOS transistor 151 is adjustable and is controlled by the second switch 154. The voltage level at the source node of the NMOS voltage follower 15 is an output voltage ($V_{out}$), while the voltage level at the gate node of the NMOS represents the input voltage ($V_{gate}$) of the voltage follower 15. When the first switch 16 is disconnected and the sensing electrode 11 is left floating, the schematic relationship of the gate node and the output node can further be simplified to the circuit shown in FIG. 8.

Figure 8:
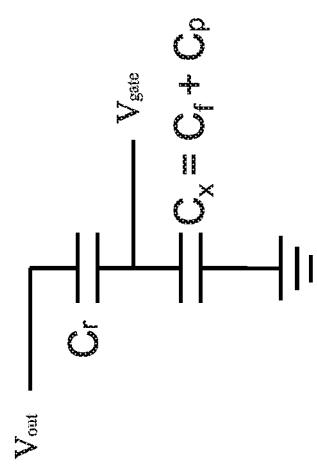
FIG. 8 is a simplified circuit diagram of the circuit in FIG. 7.

Please refer to FIG. 6 and FIG. 8 at the same time. Here, only the typical-typical (TT) process corner is taken into account. Consider the typical $I_d$-to-$V_{gs}$ curve of saturation region in FIG. 6. The two bias current level (4 uA and 1 uA provided by the adjustable current source at different steps) correspond to the two operation points at ($V_{gs\_0}$, 4 uA) and ($V_{gs\_1}$, 1 uA). In the initial steps (S01 and S02), the voltage level at gate node of the NMOS transistor 151 ($V_{gate\_0}$) equals to the bias voltage ($V_{bias}$=1.5V), and the voltage level at the source node of the NMOS transistor 151 is $$V_{out\_0} = V_{gate\_0} - V_{gs\_0} = V_{bias} - V_{gs\_0} \quad (1).$$

After step S03, the voltage level at the source node of the NMOS transistor 151 becomes $$V_{out\_1} = V_{gate\_1} - V_{gs\_1} \quad (2).$$

Also, by the voltage law of series capacitor ($C_x$ and $C_r$ in FIG. 8), we have:

$$\Delta V_{gate} = \Delta V_{out} \frac{C_r}{C_r + C_x}, \quad (3)$$

where $C_x = C_f + C_p$, $\Delta V_{gate} = V_{gate\_1} - V_{gate\_0}$, and $\Delta V_{out} = V_{out\_1} - V_{out\_0}$. Substituting equation (1) and (2) into equation (3), $V_{out\_1}$ can be obtained as following:

$$V_{out\_1} = \frac{C_r}{C_x}(V_{gs\_0} - V_{gs\_1}) + V_{bias} - V_{gs\_1}. \quad (4)$$

This result shows that the final output voltage ($V_{out\_1}$) equals to $$\frac{C_r}{C_x}$$

times a voltage constant ($V_{gs\_0} - V_{gs\_1}$) and then plus a voltage constant ($V_{bias} - V_{gs\_1}$). Thus, the output voltage is proportional to the ratio $$\frac{C_r}{C_x}$$

with a constant offset. It is clear that the sensitivity can be increased by a larger value of $C_r$ and a smaller value of $C_p$ in $C_x$.

Please refer to FIG. 6 again. Process variation is a critical issue in semiconductor manufacturing. The causes of process variation include: inaccurate transistor gate width and/or length, doping, dielectric thickness, gate material, and conductor edge roughness, etc. Under the effect of process variation, the value $V_{out}$ may drift when $V_{gs\_0}$ and $V_{gs\_1}$ change. The fast-fast (FF) corner causes the curve to move towards lower $V_{gs}$ values. The slow-slow (SS) corner causes the curve to move towards higher $V_{gs}$ values. When the current levels are kept the same, a correlation between the deviations of operation point at $V_{gs\_0}$ and $V_{gs\_1}$ can be observed. A "ratio of change" $\Delta V_{gs\_0}:\Delta V_{gs\_1}$ can be empirically determined by the amount of deviation of $V_{gs\_0}$ and $V_{gs\_1}$ from the FF process corner to the SS process corner. The voltage change caused by process variation at the first operation point and that at the second operation point are defined as following:

$$\Delta V_{gs\_0} = V_{gs\_0}(SS) - V_{gs\_0}(FF)$$

$$\Delta V_{gs\_1} = V_{gs\_1}(SS) - V_{gs\_1}(FF)$$

Further considering the case when the finger is absent, i.e., $C_f = 0$ and $C_x = C_p$, the array of sensing units should produce an image of good uniformity, which implies a minimum variation of $V_{out\_1}$ from pixel to pixel. In this case, equation (4) can be rewritten as the following:

$$V_{out\_1} = \frac{C_r}{C_p} V_{gs\_0} - \left(\frac{C_r + C_p}{C_p}\right) V_{gs\_1} + V_{bias}. \quad (5)$$

Due to the minus sign of the second term in equation (5), if the design parameters are chosen in a way such that the effect of the voltage change caused by process variation at the first operation point ($\Delta V_{gs\_0}$) can be compensated by the effect of the voltage change caused by process variation at the second operation point ($\Delta V_{gs\_1}$), then the output voltage ($V_{out\_1}$) remains the same when $V_{gs\_0}$ and $V_{gs\_1}$ change due to process variation. In other words, the design parameter is chosen to meet the relationship:

$$\Delta V_{gs_0}:\Delta V_{gs_1} = (C_r + C_p):C_r \quad (6).$$

In this way, the process variation can be compensated by either choosing a proper value of $C_r$ and/or $C_p$ as the design parameter, or adjusting the bias current pair which determines $V_{gs\_0}$ and $V_{gs\_1}$ to satisfy equation (6). In reality, it is difficult to be 100% accurate. Therefore, the compensation factor should be controlled within a reasonable range. For an acceptable image quality, a range of tolerance is defined as following:

$$90\% * \frac{(C_r + C_p)}{C_r} \le \frac{\Delta V_{gs\_0}}{\Delta V_{gs\_1}} \le 110\% * \frac{(C_r + C_p)}{C_r}$$

Figure 9D:
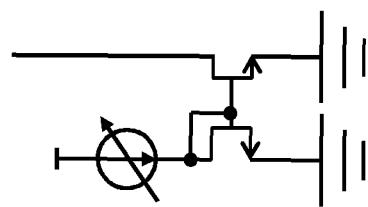
FIGS. 9(a) to 9(d) show schematic circuit diagrams of alternative methods forming an adjustable current source.
Figure 9C:
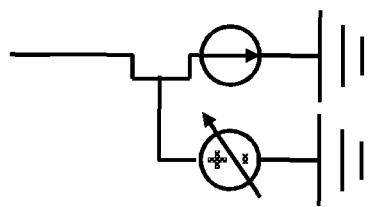
Figure 9B:
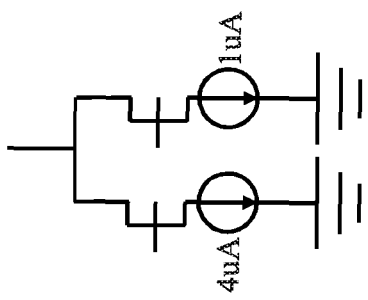
Figure 9A:
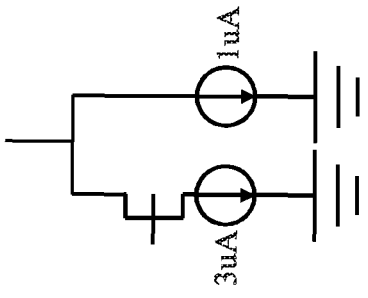

Please refer to FIGS. 9(a) to 9(d), alternative methods to form the adjustable current source are shown. In FIG. 9(a), the adjustable current source comprises two constant current sources providing current levels at 1 uA and 3 uA, respectively. The adjustable current source provides a constant current level at 4 uA while the switch is turned on, and at 1 uA while the switch is turned off. In FIG. 9(b), the adjustable current source comprises two constant current sources providing current levels at 1 uA and 4 uA, respectively. The adjustable current source provides a constant current level at 4 uA while the left switch is turned on and the right switch is turned off, and at 1 uA while the left switch is turned off and the right switch is turned on. The adjustable current source in FIG. 9(c) is a bias voltage controlled current mirror, and the adjustable current source in FIG. 9(d) is a current controlled current mirror. The adjustable current source may also be, for example, an adjustable current mirror described by Costas Laoudias, Costas Psychalinos (2010), 'Low-voltage CMOS adjustable current mirror', Electronics Letters 46(2):124-126• February 2010. In this case, the adjustable current source can provide at least two different current levels to the MOS transistor 151.

Figure 10:
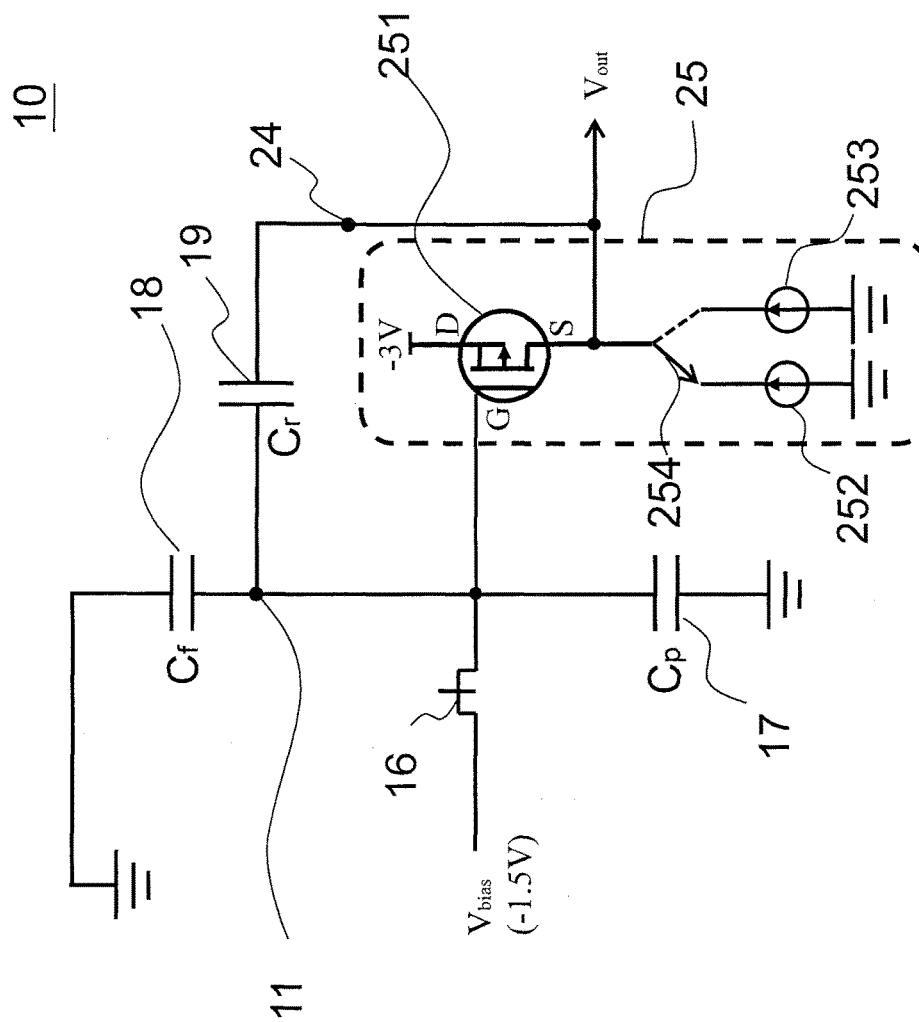
FIG. 10 is another schematic circuit diagram of the sensing unit according to the present invention.

Please refer to FIG. 10. FIG. 10 is another schematic circuit diagram of the sensing unit according to the present invention. The differences between the present embodiment and the previous embodiment in FIG. 7 are the voltage follower and the bias voltage. A voltage follower 25 in the present embodiment is a PMOS voltage follower and comprises: a PMOS transistor 251, a third constant current source 252, a fourth constant current source 253, and a third switch 254. A drain node (D) of the PMOS transistor 251 is connected to a power source for providing power to the voltage follower 25. The power source in the present embodiment is a power source with a negative potential, e.g., −3V. A source node (S) of the PMOS transistor 251 is connected to one node of the third switch 254 and serves as an output node of the voltage follower 25. A gate node (G) is connected to the sensing electrode 11 and serves as an input node of the voltage follower. A bulk node connected to the source node. The third and the fourth constant current sources 252 and 253 are formed between the third switch 254 and ground, respectively. The third switch 254 switches between a third constant current source 252 and a fourth constant current source 253, for providing different constant current levels for operating the PMOS transistor 251 at different steps. A higher constant current level is provided for setting up the bias voltage to the voltage follower 25. A lower constant current level is provided for reading the output voltage. The bias voltage in the present embodiment is a negative voltage, i.e. −1.5V, to cooperate with the voltage of the power source of the voltage follower 25.

What is claimed is:

1. A capacitive sensing unit for a capacitive fingerprint sensor, comprising:
   a sensing electrode;
   a first switch, for providing a constant bias voltage to all components connected to the sensing electrode while being switched on;
   a voltage follower, comprising:
     an adjustable current source, for providing at least two distinct current levels; and
     a MOS transistor, comprising:
       a source node, connected to ground via the adjustable current source and serves as an output node of the voltage follower;
       a gate node, connected to the sensing electrode and serves as an input node of the voltage follower;
       a drain node, connected to a power source, for providing power to the voltage follower; and
       a bulk node, connected to the source node; and
   a reference capacitor, formed between the output node of the voltage follower and the sensing electrode.

2. The capacitive sensing unit according to claim 1, wherein the adjustable current source provides a first current level for setting up the bias voltage to the voltage follower and at least a second current level for reading the output voltage.

3. The capacitive sensing unit according to claim 1, wherein the at least two distinct current levels are constant current levels.

4. The capacitive sensing unit according to claim 1, wherein the adjustable current source comprises:
   a first constant current source;
   a second constant current source; and
   a second switch, for switching between the at least two distinct current levels.

5. The capacitive sensing unit according to claim 4, wherein the adjustable current source further comprises a third switch, for switching between the at least two distinct current levels.

6. The capacitive sensing unit according to claim 1, wherein the adjustable current source is a bias voltage controlled current mirror.

7. The capacitive sensing unit according to claim 1, wherein the adjustable current source is a current controlled current mirror.

8. The capacitive sensing unit according to claim 1, wherein the sensing electrode is a conductive plate.

9. The capacitive sensing unit according to claim 1, further comprising:
   a lower conducting layer connected to the output node of the voltage follower; and
   at least one insulating layer, formed between the sensing electrode and the lower conducting layer,
   wherein the reference capacitor is formed between the conductive plate and the lower conducting layer.

10. The capacitive sensing unit according to claim 1, wherein the MOS transistor is operated at least two distinct operation points in the saturation region, and the process variation of the sensing unit can be compensated by having the design parameters to meet the relationship:

$$90\% * \frac{(C_r + C_p)}{C_r} \le \frac{\Delta V_{gs\_0}}{\Delta V_{gs\_1}} \le 110\% * \frac{(C_r + C_p)}{C_r}$$

wherein $C_r$ is the capacitance of the reference capacitor, $C_p$ is the capacitance of the parasitic capacitor naturally formed between ground and the sensing electrode, $\Delta V_{gs\_0}$ is the voltage change caused by process variation at a first operation point, and $\Delta V_{gs\_1}$ is the voltage change caused by process variation at a second operation point.

11. The capacitive sensing unit according to claim 1, wherein a capacitor is formed between the sensing electrode and an object while the object is detected by the capacitive sensing unit; one node of the capacitor is formed by the sensing electrode and another node is formed by the surface of the object; the object is connected to ground; and the MOS transistor is operated in saturation region.

12. A capacitive fingerprint sensor, comprising a plurality of capacitive sensing units according to claim 1 to form a fingerprint sensing array.

13. A sensing circuit, for measuring a capacitance formed between an object and the sensing circuit, comprising:
   a sensing electrode, wherein the capacitance is formed between the object and the sensing electrode;
   an output node, wherein an output voltage is measured at the output node;
   a reference capacitor, wherein one node of the reference capacitor is connected to the sensing electrode and the other node is connected to the output node;
   a MOS transistor, comprising:
     a source node;
     a gate node, connected to the sensing electrode;
     a drain node, connected to a power source for providing power to the transistor; and
     a bulk node, connected to the source node; and
   an adjustable current source, formed between the source node of the MOS transistor and ground, for providing at least two distinct current levels to the MOS transistor,
   wherein the MOS transistor is operated in the saturation region;
   wherein the MOS transistor and the adjustable current source together behaves as a voltage follower; and
   wherein the capacitance has one node connected to ground, and another node connected to the sensing electrode.

14. The sensing circuit according to claim 13, wherein the at least two distinct current levels comprise a first current level for providing a constant bias current level for setting up the bias voltage to the voltage follower; and at least a second current level for reading the output voltage.

* * * * *